United States Patent
Wang et al.

(10) Patent No.: US 11,188,508 B1
(45) Date of Patent: Nov. 30, 2021

(54) HIGH-PERFORMANCE LEARNING-READY PLATFORM FOR REAL-TIME ANALYTICS

(71) Applicant: Synopsys, Inc., Mountain View, CA (US)

(72) Inventors: Yibing Wang, Santa Clara, CA (US); Smarahara Misra, San Jose, CA (US); Sashikala Obilisetty, Cupertino, CA (US)

(73) Assignee: Synopsys, Inc., Mountain View, CA (US)

( * ) Notice: Subject to any disclaimer, the term of this patent is extended or adjusted under 35 U.S.C. 154(b) by 396 days.

(21) Appl. No.: 15/949,526

(22) Filed: Apr. 10, 2018

Related U.S. Application Data (60) Provisional application No. 62/484,325, filed on Apr. 11, 2017.

(51) Int. Cl.
| | |
|---|---|
| *G06F 16/215* | (2019.01) |
| *G06F 16/22* | (2019.01) |
| *G06F 16/11* | (2019.01) |
| *G06F 16/951* | (2019.01) |
| *G06F 9/54* | (2006.01) |
| *G06N 20/00* | (2019.01) |
| *G06F 30/30* | (2020.01) |

(52) U.S. Cl.
CPC ........ *G06F 16/2228* (2019.01); *G06F 16/113* (2019.01); *G06F 16/951* (2019.01); *G06F 9/541* (2013.01); *G06F 30/30* (2020.01); *G06N 20/00* (2019.01)

(58) Field of Classification Search
CPC .. G06F 16/2228; G06F 16/113; G06F 16/951; G06F 30/30; G06F 9/541; G06N 20/00
See application file for complete search history.

(56) References Cited

U.S. PATENT DOCUMENTS

| | | | |
|---|---|---|---|
| 7,827,447 B2 | 11/2010 | Eberbach et al. | |
| 8,875,087 B1 | 10/2014 | Li et al. | |
| 9,646,262 B2 | 5/2017 | Philipps et al. | |
| 2004/0167912 A1* | 8/2004 | Tsui | G06F 16/958 |
| 2011/0276744 A1* | 11/2011 | Sengupta | G06F 12/0246 |
| | | | 711/103 |
| 2017/0116283 A1* | 4/2017 | Park | G06F 16/24568 |

OTHER PUBLICATIONS

Upverter. Documentation of Open JSON Format. upverter.com. 2012-2017. pp. 1-16. (Year: 2017).*

* cited by examiner

*Primary Examiner* — Alex Gofman
*Assistant Examiner* — Shelly X Qian
(74) *Attorney, Agent, or Firm* — Fenwick & West LLP (57) ABSTRACT

A system and method for operating a high-performance learning-ready platform for real-time analytics involves operating a collector to collect logging data from electronic design automation (EDA) tools. The collector operates either (A) a set of programming interface (i.e., function calls) integrated with an EDA tool, or (B) a selector to extract the logging data from EDA tool logs. The collector generates data logs in a key-value pair data logging format from the logging data. A memory controller loads and indexes the data logs into a controlled memory data structure. A comparator in an archiving engine prioritizes storage of particular data logs based, in part, on previously stored data logs in the controlled memory data structure.

20 Claims, 8 Drawing Sheets

```
Extract File Sample: extract_VCS.json (snipped)
{                                                              300
  "toolName": "VCS",         302
  "regEx": [                   304      308
    {
      "inExpr": "^Chronologic VCS\(TM\)$",
      "data":   [{ "inPosition": [1, 2, 3], "outKey": "_tool_name_", "outType": "STRING"}]
    },                       306                                310
    {
      "inExpr": "^Parsing design file",
      "data":   [{ "inPosition": [4], "outKey": "input", "outType": "STRING"}]
    },
    {
      "inExpr": "^recompiling module",
      "data":   [{ "inPosition": [3], "outKey": "recompiled modules", "outType": "STRING"}]
    },
    {
      "inExpr": "^CPU Time:+[0-9]*\.[0-9]+seconds;+Data structure size:+[0-9]*\.[0-9]+(Kb|Mb|Gb)",
      "data":   [{ "inPosition": [3, 4], "outKey": "_cpu_", "outType": "DOUBLE"},
                 { "inPosition": [8], "outKey": "Data structure size", "outType": "DOUBLE"}]
    },
    {
      "inExpr": "^CPU time:+[0-9]*\.[0-9]+seconds to compile\+...\+[0-9]\.[0-9]+seconds in simulation",
      "data":   [{ "inPosition": [3, 4], "outKey": "cpu compile time", "outType": "DOUBLE"},
                 { "inPosition": [8, 9], "outKey": "cpu elab time", "outType": "DOUBLE"},
                 { "inPosition": [13, 14], "outKey": "cpu link time", "outType": "DOUBLE"},
                 { "inPosition": [18, 19], "outKey": "cpu sim time", "outType": "DOUBLE"}]
    },
    {
      "inExpr": "^(Mon|Tue|Wed|Thu|Fri|Sat|Sun)+(Jan|Feb|Mar|Apr|May|Jun|Jul|Aug|Sep|Oct|Nov|Dec)([0-3])[0-9]",
      "data":   [{ "inPosition": [5,2,3,4], "outKey": "_end_", "outType": "DATETIME"}]
    }
  ]
}
```

FIG.6

HIGH-PERFORMANCE LEARNING-READY PLATFORM FOR REAL-TIME ANALYTICS

CROSS REFERENCE TO RELATED APPLICATIONS

This application claims the benefit of U.S. Provisional Application No. 62/484,325, filed Apr. 11, 2017, which is incorporated by reference in its entirety.

BACKGROUND

The advent and growth of Big Data and Machine Learning techniques necessitates the need for a learning-ready system where all required data is collected (as much of it automatically as possible) and stored for access by applications that generate insightful views and/or take actions to optimize the process at hand. A new approach and paradigm for making business decisions, called data-driven which is where companies use data to make decisions ranging from what new products to build, to improving internal business processes and product development—has becoming increasingly popular.

Chip design and manufacturing processes are built on flows where numerous electronic design automation (EDA) tools are used. Some of the tasks that EDA tools help with are in design prototyping, verifying a design before manufacture, automatic synthesis, insertion of self-test and/or scan circuitry, and analyzing a design at various stages during the design and manufacturing process.

Each stage and step in EDA is integral, and typically the data generated during each step is either discarded or as is the case more often, stored in log files for a period of time. EDA logs contain a lot of data, including important design information, run results and environment-specific data. In addition to run transaction and time-series data, EDA logs often contain rich domain specific data, in the form of sub-structures representing data hierarchies, arrays or matrices. No available open-source tools handle such richly formatted data.

Additionally, the data generated by EDA tools varies by domain (for e.g. placement and routing, or static timing analysis) with no standard format for logs generated. The most common technique used today, data collection by parsing tool logs, is error prone and highly sensitive to log format changes. In other words, analyzing data and mining valuable business information from EDA tool logs using conventional methods, such as scripting, is often time-consuming and not scalable. EDA customer companies have built home-grown solutions to address the problem, but such solutions target at most one phase of the design process—such as verification.

While the solution described herein is applicable in several domains, such as general purpose data mining, Internet of Things (IoT) platforms, self-driving car technologies, a primary beneficiary is EDA.

SUMMARY

Disclosed is a learning-ready platform for use to provide solutions for two phases: 1) Data Collection 2) Data Processing.

For Data Collection, disclosed example embodiments may include a uniform data collection mechanism that works for all data generators (or EDA tools in this case). In one embodiment, a key-value pairs that comprise tool data are collected automatically whenever an EDA tool is executed. In addition, the data collected can be completely suppressed or restricted to limited key-value pairs. Further, in cases when automatic data collection is not possible or not preferred, a log-file parsing kit can support a majority of EDA log files and generate required key-value pairs.

For Data Processing, disclosed example embodiments may include a high-performance data processing system, which processes data generated in the data collection phase, subsequently storing and integrating it in near real-time for access by downstream applications.

Together, the data collection and data processing modules provide required functionalities for solving the most difficult part for any business contemplating data-driven approaches: automatic data collection, and near real-time access to collected data.

BRIEF DESCRIPTION OF THE DRAWINGS

The disclosed embodiments have advantages and features which will be more readily apparent from the detailed description, the appended claims, and the accompanying figures (or drawings). A brief introduction of the figures is below.

DETAILED DESCRIPTION

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. One skilled in the art will readily recognize from the following description that alternative embodiments of the structures and methods illustrated herein may be employed without departing from the principles described herein.

References to "one embodiment" or "an embodiment" do not necessarily refer to the same embodiment, although they may. Unless the context clearly requires otherwise, throughout the description and the claims, the words "comprise,"

"comprising," and the like are to be construed in an inclusive sense as opposed to an exclusive or exhaustive sense; that is to say, in the sense of "including, but not limited to." Words using the singular or plural number also include the plural or singular number respectively, unless expressly limited to a single one or multiple ones. Additionally, the words "herein," "above," "below" and words of similar import, when used in this application, refer to this application as a whole and not to any particular portions of this application. When the claims use the word "or" in reference to a list of two or more items, that word covers all of the following interpretations of the word: any of the items in the list, all of the items in the list and any combination of the items in the list, unless expressly limited to one or the other. Any terms not expressly defined herein have their conventional meaning as commonly understood by those having skill in the relevant art(s).

Various logic functional operations described herein may be implemented in logic that is referred to using a noun or noun phrase reflecting said operation or function. For example, an association operation may be carried out by an "associator" or "correlator". Likewise, switching may be carried out by a "switch", selection by a "selector", and so on.

"Circuitry" in this context refers to electrical circuitry having at least one discrete electrical circuit, electrical circuitry having at least one integrated circuit, electrical circuitry having at least one application specific integrated circuit, circuitry forming a general purpose computing device configured by a computer program (e.g., a general purpose computer configured by a computer program which at least partially carries out processes or devices described herein, or a microprocessor configured by a computer program which at least partially carries out processes or devices described herein), circuitry forming a memory device (e.g., forms of random access memory), or circuitry forming a communications device (e.g., a modem, communications switch, or optical-electrical equipment).

"Firmware" in this context refers to software logic embodied as processor-executable instructions stored in read-only memories or media.

"Hardware" in this context refers to logic embodied as analog or digital circuitry.

"Logic" in this context refers to machine memory circuits, non-transitory machine readable media, and/or circuitry which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

"Programmable device" in this context refers to an integrated circuit designed to be configured and/or reconfigured after manufacturing. The term "programmable processor" is another name for a programmable device herein. Programmable devices may include programmable processors, such as field programmable gate arrays (FPGAs), configurable hardware logic (CHL), and/or any other type programmable devices. Configuration of the programmable device is generally specified using a computer code or data such as a hardware description language (HDL), such as for example Verilog, VHDL, or the like. A programmable device may include an array of programmable logic blocks and a hierarchy of reconfigurable interconnects that allow the programmable logic blocks to be coupled to each other according to the descriptions in the HDL code. Each of the programmable logic blocks may be configured to perform complex combinational functions, or merely simple logic gates, such as AND, and XOR logic blocks. In most FPGAs, logic blocks also include memory elements, which may be simple latches, flip-flops, hereinafter also referred to as "flops," or more complex blocks of memory. Depending on the length of the interconnections between different logic blocks, signals may arrive at input terminals of the logic blocks at different times.

"Software" in this context refers to logic implemented as processor-executable instructions in a machine memory (e.g. read/write volatile or nonvolatile memory or media).

"Collector" in this context refers to logic to retrieve outputs from monitored hardware/software components and/or systems. The outputs describing the activity or status of the components and/or system "Comparator" in this context refers to a logic element that compares two or more inputs to produce one or more outputs that reflects similarity or difference of the inputs. An example of a hardware comparator is an operational amplifier that outputs a signal indicating whether one input is greater, less than, or about equal to the other. An example software or firmware comparator is: if (input1==input2) output=val1; else if (input1>input2) output=val2; else output=val3; Many other examples of comparators will be evident to those of skill in the art, without undo experimentation.

"Memory controller" in this context refers to logic unit or digital circuit that manages the flow of data going to and from a computer's main memory or controlled memory structure.

"Selector" in this context refers to a logic element that selects one of two or more inputs to its output as determined by one or more selection controls. Examples of hardware selectors are multiplexers and demultiplexers. An example software or firmware selector is: if (selection control==true) output=input1; else output=input2; Many other examples of selectors will be evident to those of skill in the art, without undo experimentation.

Disclosed is a system for operating a high-performance learning-ready platform for real-time analytics that may involve operating a collector to: collect logging data from electronic design automation (EDA) tools; extract the logging data from EDA tool logs through operation of a selector; and generate data logs in a key-value pair data logging format from the logging data. A memory controller loads and indexes the data logs into a controlled memory data structure through operation of a memory controller. A comparator in an archiving engine prioritizes storage of particular data logs based, in part, on previously stored data logs in the controlled memory data structure. Also disclosed is a corresponding method and non-transitory computer readable storage medium comprising stored instruction for execution of the method in a computing system.

An example embodiment to build a learning-ready platform may include solutions for the two phases of a learning-ready platform: 1) data collection 2) data processing.

For data collection, the main idea is to define (1) a common logging format, (2) a set of simple API for logging and a light-weight implementation of the application programming interface (API), and (3) an extensible format for data extraction from EDA tool logs The common logging format is built on the key-value pair data model, with additional in-memory data storage type and optional attribute information. A key is the name of a given data object; a value is that data object's value. A special, simple, syntax is used to mark each field in an entry in the log, which arranges its data entries in tabular format, yet the data entries do not have to follow one static, universal schema.

The API offers logging operations, such as file open/close, data writing, etc. File completion and data integrity are guaranteed through atomic file operations. The library auto collects generic tool data such as tool name, tool version, PID (process identifier), memory usage, central processing unit (CPU) usage, etc.; and run-time environment information, such as host name, environment variables, etc. Domain specific data from the integrated EDA tools is written to the log on demand, through one generic function call. Such log data can be stored under current working directory or a designated NFS (network file system) disk location, or be sent to a stream data server.

The extensible format for logfile data extraction is based on creating customized tool-specific files with "regular expressions" called extract files, to identify key-values in the tool-generated logfile.

For data processing, log data is loaded to a storage system, indexed and stored by a search engine or any no-SQL data store, and archived on a modern filesystem, aimed for scalability, fault-tolerance, and fast information retrieval.

Each of the four key components are described in further detail below.

CLL LOG Format

A CLL (common logging library) log entry is an output of a process to create a common log format from disparate log formats, e.g., as are generated by EDA tools. In one example embodiment, the CLL log entry follows the following format as described below. The angled and curly brackets are notational markers and are not part of the log information. Fields inside angled brackets are essential, fields inside curly brackets are optional.

The CLL log entry may be structured as an argumented key value pair. Each field of the key value pair is separated by a vertical bar, i.e., "|". The CLL log entry may begin with a key and thereafter nay include annotated values as shown below:

<key>|<data type>|<value>{attribute} {hint}

The first field is the name of a given data object.
The second field is the keyword for a CLL data type.
The third field is the value of a given data object.
The fourth field has optional attribute information of that data entry.
The last field is used internally by a CLL log processing program. One example of the hint field is "ARCHIVE", which tells CLL log processing program that besides being indexed and stored in a search engine or data store, the original content of this entry (e.g., a file) needs to be stored in an archiving system.

By way of example, the key may be a keyword. This may be, for example, name of data or a variable name. The data type corresponds to a type of the data. The value is a value of the type of data. The attribute may be an additional string that can be a common or unit that a user may seek to attach to value. A hint may be a string for data gathering system as to how to organize the data. It is noted that the fourth (attribute) and the fifth fields (hint) may be optional fields of the CLL log entry. A benefit of the CLL log entry format as noted above and herein is that it provides a common log format for EDA tools that otherwise have only their own log format available, which may be incompatible with other EDA tools.

Predefined CLL data types are:
BOOL For Boolean data
INT For integer data
LONG For long integer data
FLOAT For single-precision floating-point data
DOUBLE For double-precision floating-point data
STRING For null-terminated string data
DATETIME For date/time information
FILENAME For file pathname information
JSON For JSON string
BLOB For binary data block.

CLL Log Name

A CLL log name is made up of the following components: user name or user id, machine name, process id (pid), datetime in the form of YYYYMMDD.hhmmss. These components together provide the guarantee that a CLL log filename is unique. For example, joe.peemt1311.19299. 20161116.151539.cll.

One advantage of having unique CLL format file (or CLL file) name is that, when a CLL document is indexed, the file name can be used as the document's ID.

Intermediate CLL file has a suffix .tmp. Only completed and finalized CLL files are renamed, at CLL_close( ) time or program exit time, to .cll (or .cle if encrypted).

File renaming is an atomic operation, and provides the needed guarantee that only finalized CLL files are processed, and are processed once and only once.

CLL Log Version

For backward compatibility reasons, the first entry of every CLL log is the CLL format version. The key name for that entry is _cfv_. For example, _cfv_|STRING|0.4

STRING type is used so that _cfv_ can have a string value instead of a number.

CLL API

The most often used CLL API consists of three function calls below.

1. int CLL_open (CLL_cfg_t const *cfg, bool newop, CLL_log_t **log)

Begin logging. This call creates a log file or opens an existing log file, automatically collects a set of generic tool run data, and stores the data in the log file.

The CLL logging configuration structure, CLL_cfg_t, is defined as the following.

typedef struct CLL_cfg_s {
/** Enable or disable CLL functionality. This decides whether CLL functionality should be turn on or off at run time. If set to false, CLL functionality will be turned off, i.e., CLL will be effectively disabled and its calls will run as dummy functions.*/
bool enabled;
/** Encrypt log data. If set to true, CLL log content will be encrypted. */
bool encrypt;
/** Tool name. Must be set by an EDA tool that integrates CLL. It is recommended to use an official or trademarked tool name, for intellectual property protection as well as formalization reasons.
char const * tool_name;
/** Tool version. Must be set by an EDA tool that integrates CLL. */
char const * tool_version;

```c
/** Tool log file pathname. Set to the full pathname of an
    EDA tool runs log file. Need to be set by an EDA tool
    that integrates CLL. */
char const * tool_log;
/** If set to true, CLL does not register logging operations
    at program exit time. By default, its value is set to false.
    If libcll symbols are dynamically loaded and unloaded
    before program exits, set this parameter to true to avoid
    exit time SEGV. */
bool noatexit;
/** Disable automatic DP data collection in CDPL DP
    context. By default, CLL collects a few DP key-value
    pairs so that master-generated CLL and worker-gener-
    ated CLL can be "connected". If disabled, application
    program needs to define its way to connecting master-
    generated CLL and worker-generated CLL */
bool noautodp;
} CLL_cfg_t;
```

One configuration parameter is CLL_cfg_t::noatexit. If set to be true, CLL library will not register a program exit handler. If not set, by default CLL library will register a program exit handler. The purpose of an exit handler is to attach extra operations to the end of a program's running, and the operations are invoked only when a program exits normally, i.e., invokes exit( ).

If configured to not register an exit handler, CLL library would conduct certain operations, such as automatic program performance data collection, at log closing time.

If configured (default) to register an exit handler, CLL library would conduct certain operations at program exit time. Conducting such operations at program exit time has the advantage of having bigger coverage of a program's run time information; whereas when done at CLL log close time, which is not necessarily near the program's exit time, such performance measurements may not be accurate.

Automatically collected data include the followings.
_tool_name_: This EDA tool's name. STRING typed.
_tool_version_: This EDA tool's version. STRING typed.
_tool_log_: This tool run's major log file pathname. FILENAME typed.
_start_: Extrapolated program start time. DATETIME typed.
_open_: CLL open date time. DATETIME typed.
_system_: OS name and version. STRING typed.
_processor_: Host machine processor information. STRING typed.
_hostname_: Host machine name. STRING typed.
_user_: Name of this tool-run's owner. STRING typed.
_project_: Project name for this tool run. STRING typed.
_env_: Environment variables for this tool-run. STRING typed.
_cmd_: Command line for this tool-run. STRING typed.
_pid_: Current process' ID. INT typed.
_ppid_: Current process' parent process' ID. INT typed.
_pgrp_: Current process' group ID. INT typed.
_sid_: Current process' session ID. INT typed.
_cwd_: Current process' working directory. STRING typed 2. void CLL_close (CLL_log_t**const log)00
End Logging The basic functionality of an end logging call is to close a CLL log file. If configured at CLL_open( ) time, however, that the CLL library should not register an exit handler, this function call does several things besides closing a CLL log file. Specifically, before closing the log file, this function automatically collects and logs a few more generic tool run data. Those data entries are:

_close_: CLL close date time. DATETIME typed.
_cpu_time_: CPU time spent during the whole process run. LONG typed.
_sys_time_: System time spent during the whole process run. LONG typed.
_elapse_time_: Elapse time of the whole process run. LONG typed.
_vmpeak_: Peak virtual memory size of current process during the whole time of its run. INT typed.
_vmsize_: Current virtual memory size of current process during the whole time of its run. INT typed.
_status_: Process exit status. INT typed.
_end_: Process exiting date time. DATETIME typed.

If configured at CLL_open( ) time that the CLL library should register an exit handler, all but the "_close_" entry will be logged at program exit time.

3. int CLL_append (CLL_log_t *const log, char const *key, void *value, CLL_data_t type, char const *attr)

Add one entry to CLL log file. This is the generic function call to log domain specific data entries.

CLL API level data type is defined as the following.

```c
typedef enum {
    CLL_BOOL=0,
    CLL_INT,
    CLL_UINT,
    CLL_LONG,
    CLL LONGLONG,
    CLL_FLOAT,
    CLL_DOUBLE,
    CLL_STRING,
    CLL_DATETIME,
    CLL_FILENAME,
    CLL_JSON,
    CLL_BLOB
} CLL_data_t;
```

CLL_DATETIME, CLL_FILENAME, and CLL_JSON are similar to CLL_STRING, except that (1) CLL_DATETIME is used for logging date/time specific entries; CLL provides its "standard" date/time format when logging date/time information. (2) CLL_FILENAME is used for logging file pathname entries. For such entries, a non-NULL attribute value suggests that the content of the file needs to be archived. Otherwise, only the file's pathname is indexed and stored. (3) CLL_JSON accepts a JSON string as the value of an entry, and JSON syntax validation is applied to the input data to report syntax errors at logging time.

Besides the above three most used functions, CLL accepts array input data and matrix input data through the following two functions.

4. int CLL_append_array (CLL_log_t *const log, char const *key, void *array, size_t len, CLL_data_t type, char const *attr)

Add one array entry to CLL log file.

5. int CLL_append_matrix (CLL_log_t *const log, char const *key, void *matrix, size_t row, size_t col, CLL_data_t type, char const *attr)

Add one matrix entry to CLL log file.

Note that at API level, no new CLL data type is introduced. Users use existing CLL data type to define the storage type of data. It is the functions that tell CLL how to write the array or matrix in log file. CLL library implementation, however, introduces a new type-to-string mapping function to record the data type of array in CLL logs. The type to string mapping is like the following:

CLL_BOOL→"BOOL_ARRAY";
CLL_INT→"INT_ARRAY";
CLL_UINT→"LONG_ARRAY";

CLL_LONG→"LONG_ARRAY";
CLL_LONGLONG→"LONGLONG_ARRAY";
CLL_FLOAT→"FLOAT_ARRAY";
CLL_DOUBLE→"DOUBLE_ARRAY";
For example, given array data
[0.00501379, 1e–13, 1e–06, 2.048e+07, 0.00501379, 0.0091, 1e–06, 3.14159],
its CLL entry looks like the following:
array_name|DOUBLE_ARRAY|[0.00501379, 1e–13, 1e–06, 2.048e+07, 0.00501379, 0.0091, 1e–06, 3.14159]

Matrix data in CLL is represented by the same set of array type strings. Matrix data is written as array of array elements: the first element in the array is the first row of the matrix presented by an array.

For example, given a 2×4 matrix data
|0.00501379 1e–13 1e–06 2.048e+07
0.00501379 0.0091 1e–06 3.14159|,
its CLL entry looks like the following:
matrix_name|DOUBLE_ARRAY|[[0.00501379, 1e–13, 1e–06, 2.048e+07], [0.00501379, 0.0091, 1e–06, 3.14159]]

6. Distributed Processing (DP) Data

CLL library automatically collects DP identification data as the following entries. These entries allow CLL log data consumer program to connect DP master generated CLL files with DP worker generated CLL files.

_dp_sid_: A unique server id for a DP run. STRING typed.
_dp_role_: master or worker. STRING typed.
_dp_log_: DP log pathname. FILENAME typed.
_dp_worker_: Active DP worker information. STRING typed.

Logfile Data Extractor File and Framework

Figure 2:
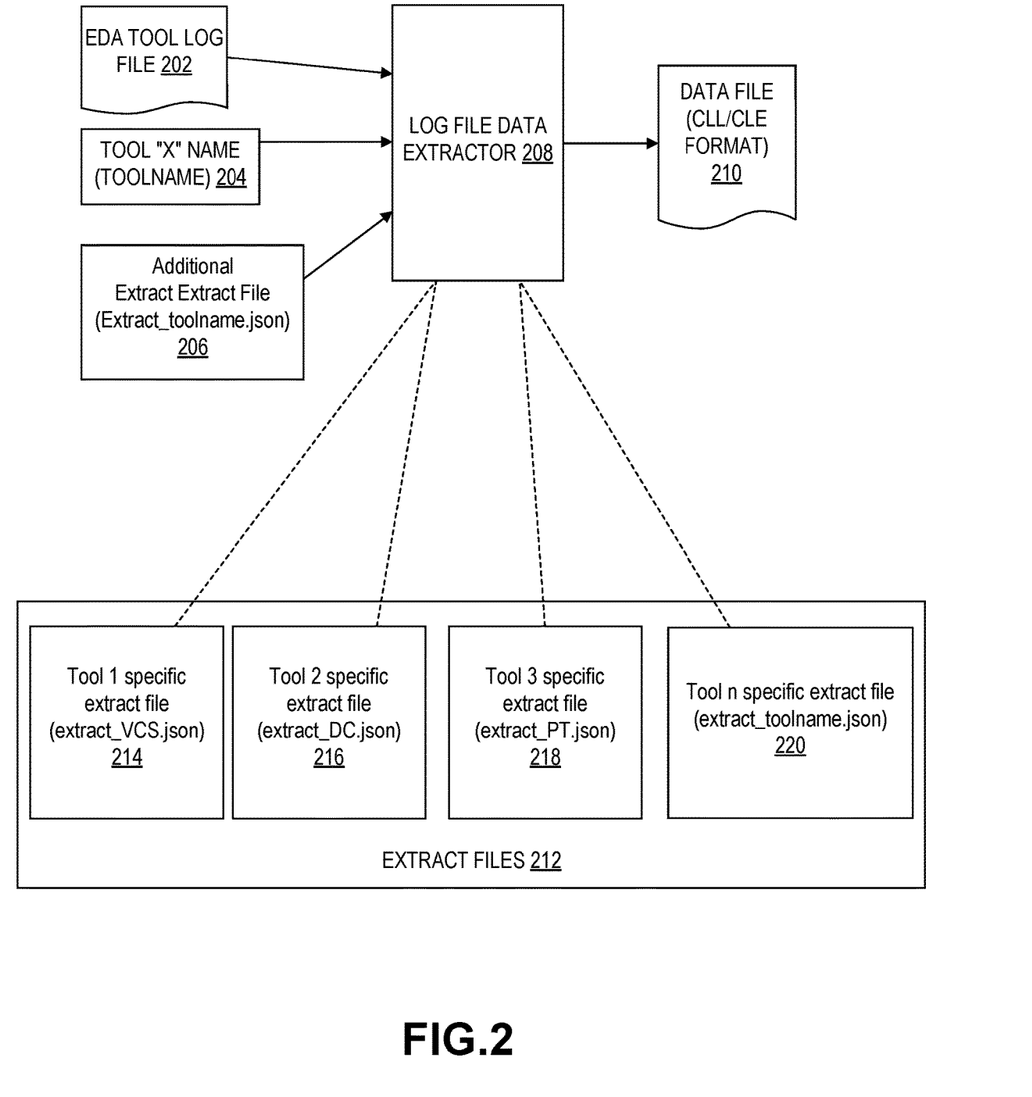
FIG. 2 illustrates an embodiment of an example process of operating a log file data extractor 200 in accordance with one embodiment.

The logfile data extractor is an extensible format for data extraction from EDA tools logs. It requires a framework as shown in FIG. 2 log file extractor. The extracted data will be written to a file in the required CLL data format (described in previous sections).

The "log file data extractor" uses a customized tool-specific file with "regular expressions", called an extract file, to identify key-values in the tool-generated logfile. This file also has the information for the fields written in the output file. An example snippet of an extract file is shown FIG. 3. The extract file may follow the JSON format given below. At a high level the format describes the values to obtain from a file, e.g., an EDA log file in a different format, to create one or more CLL log entries.

Figure 3:
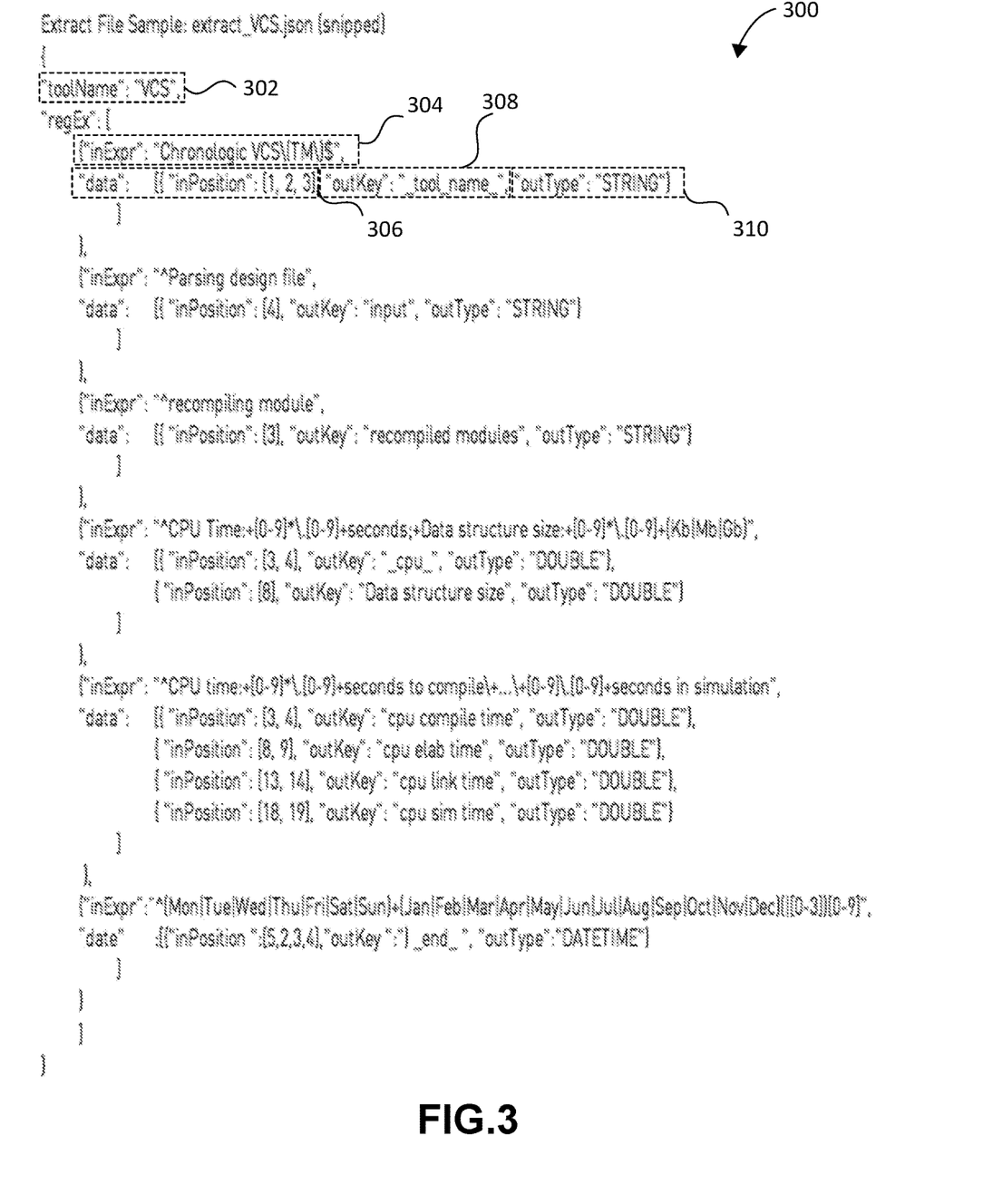
FIG. 3 illustrates an example of an extract file sample 300 in accordance with one embodiment.

```
{
"toolName":"<tool name>",
"regEx": [
  { "inExpr":"<search string>",
   "data":[ {"inPosition" : [<fld posn>,<fld Posn>], "outKey" : "<cll fld key>", "outType" : "<cll fld type" }
  ]
  },
  {"inExpr": "<search string>", "data":[ {"inPosition" : [<fld posn>], "outKey" : "<cll fld key>", "outType" : "<cll fld type>"
  },
  {"inPosition" : [<fld posn>], "outKey": "<cll fld key>", "outType" : "<cll fld type>", "outAttribute": "<attribute text>",
  "outTrim" : ["<trim char>"], "outLTrim" : ["<trim char>"],
"outRTrim" : ["<trim char>"], "outHint": "<hint text>" ,
  "outCondition" : {"<condition key>" : "<condition value>" }
  }
  ]
  }
  ]
}
```

The data in red color between the <and > symbols are the only information that the user can change. Do not use the <and > symbols when you give the values for each line in the "data" array.

Following are required: inPosition, outKey and outType.
Following are optional: outAttribute, outTrim, outLTrim, outRTrim, outHint, outCondition.

<tool name>: This is the name of the tool used to create the log file.

<search string>: String of characters you want to search in the log file, Regular expressions can be used.

<fld posn>: an integer, position of the field value in a line in the log file. The line in log file is split into tokens and numbered, starting the count from 1. There can be more than one integer in a comma separated list like: [4] or [4,5,6,].

<cll fld key>: This is the key like _cpu_, _tool_version_, etc. for the fields in CLL file.<attribute text>: This is the attribute text that will go to the CLL line in the attribute position <trim char>: This is the character that will be trimmed (either both sides, left side or right side). If there is more than one char to be trimmed, they can be put in the array, e.g.:

<hint text>: This is the hint that will go the hint position in the CLL line in the CLL file. A hint of NOARCHIVE is used for FILENAME cll type for not archiving the file.

<condition key>, <condition value>: CLL line is sent to CLL file only if condition key matches condition value, otherwise its not printed to CLL file.

<cll fld type>: This is the CLL field type like INT, STRING etc, or internal scope VARIABLE.

The supported CLL field types are: BOOL, INT, LONG, FLOAT, DOUBLE, STRING, DATETIME, FILENAME.

VARIABLE makes it an internal variable which is itself not printed to the CLL file, but can be used as a conditional variable using the outCondition key.

The DATETIME field position numbering is as follows, with the integer token positions:
[t1, t2, t3, t4]: t1=year, t2=month, t3=date, t4=time
E.g.:
Log file line: Current time: Tue Dec 15 10:33:57 2015
Extract file:
{"inExpr":"^Current time:",
 "data":[{"inPosition": [7,4, 5,6], "outKey": "_start_", "outType": "DATETIME" }
}
CLL file line: _start_|DATETIME|2015-12-15 10:33:57

There can be any number of search strings. The line matching the search string is broken into tokens with space used as a token delimiter.

The default extract file is stored in the $CERBERUS_HOME/lib folder.

The user has the option to specify custom extract file in the command line

The extract file name has the format: extract_<tool Name>.json. Example: extract_VCS.json There is only one extract file for each tool. It has the search information for all the versions of the tool.

For each line in the log file, only the first matching string in the extract file will be used to extract data. Subsequent matching for remaining regular expressions will not be done.

CLL (Log) Consumer Flow

Figure 4A:
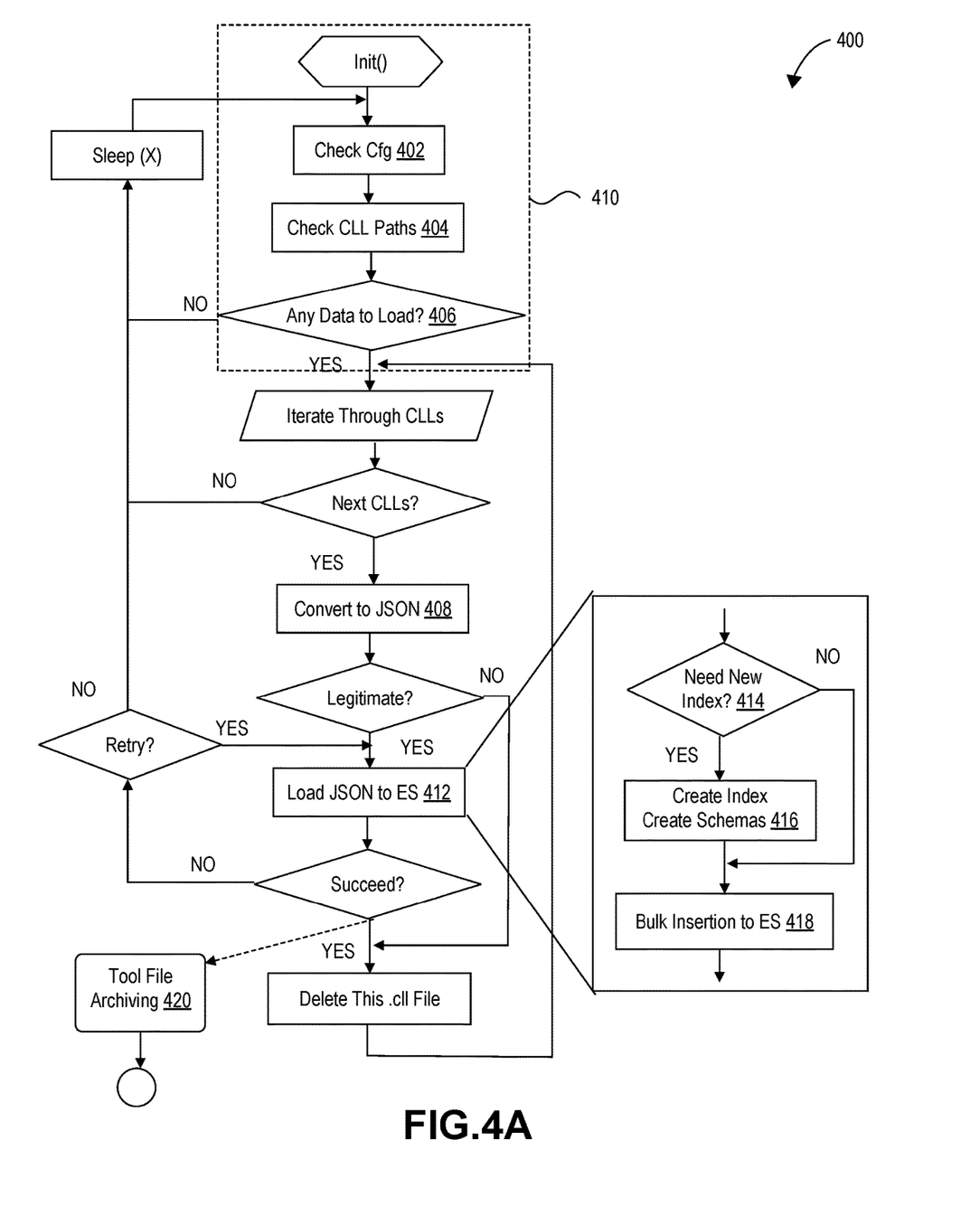
FIG. 4A illustrates an example of a CLL consumer flow 400 in accordance with one embodiment.

A CLL log consumer (1) loads and processes CLL log files, and (2) stores the processed data into a data store. A conceptual flow chart is shown in FIG. 4A.

To achieve good throughput, CLL consumer adopts a data processing pipeline, which is made of a few concurrent threads (or processes, we use only the term threads in the following discussions), shown in FIG. 5.

In CLL consumer's data processing pipeline, shown above, the three major threads are:

CLL processing and conversion (convert for short) thread;
Document loading and indexing (load for short) thread;
Tool input/output file archiving (archive for short) thread.

The convert thread generates intermediate data to be indexed and stored in a data store.

The load thread sends the processed CLL data as a document to a search engine to be indexed and stored.

The archive thread reads input/output files from their on-disk locations, and archives the file contents in an archive server. Archiving only applies to CLL entries that are filenames and are marked as to be archived (through the "hint" fields).

Among the three threads, the convert thread and the load thread have high priority, whereas the archive thread has low priority, meaning the archive thread does not determine when a data processing cycle starts. In other words, the archive thread can work in the background, in asynchronous online or offline fashion.

In each of its processing cycle, CLL consumer makes a "snapshot" of available CLL files, and processes them in chunks, depending on the size of memory buffers that the consumer is configured to use.

There will be a pause between two successive data processing cycles, so that the load thread has enough time to delete previously loaded CLL files. The load thread also hands over a list of tool input/output file pathnames in the form of on-disk files or in-memory database file to the archive thread, to allow it to work on the list of files to be archived at any configurable pace.

Archiving Engine

The archiving engine maintains two task queues: task queue A and task queue B. Task queue A is for the lists of files to be archived. Upon receiving a (new) list of pathnames of files that need to be archived, the archiving engine appends the list to task queue A.

When archiving a file, the archiving engine checks if the file exists on the archiving server (or file system, we use only the term server in the following discussions):

```
IF the file has not been archived before, THEN
  make a copy on the archive server.
ELSE
  check if the file is in "completed" state
  IF not in complete state, THEN
    delete the archived copy,
    make a (new) copy on the archive server.
  ELSE
    skip, no action needed.
  ENDIF
ENDIF
```

Upon completion of archiving a file, the archiving engine removes that file entry from task queue A, and puts it into task queue B, with additional information for that file entry; those additional information includes the file's location on the archive server, file size, and checksum. File entries in task queue B will be updated on the indexing data store with the additional archiving information. Such information can be used to retrieve the archived file's original content, when searched through the indices data store.

If a file in task queue A does not exist at the given location as suggested by the file's pathname, the archiving engine simply by-passes (and removes it from task queue A) the missing file, and continues to process the next task.

Special techniques used by the archive engine include:
File Compression

Before archiving a file, compress it first if the file is not already compressed. The archive engine maintains a list of known compression file formats. Depending on the archive server type, file sharding mechanism, and other requirements, the archive engine will pick a proper algorithm to do the compression.

Timed Hierarchy for Tool Logs

For tool run logs, each log is unique, so checksum would not help reducing the number of duplications unless when the same log file is archived more than once. On the other hand, we take advantage of this property and introduce timed hierarchical structure for storing logs. For example, a log archive structure might be like the following:

/archive/log/yyyy/mm/dd, where the year, month, and date of a log file is its last modification time. This helps speeding up file searches.

File Size Limit

Use file size limit to filter out files that are too large. This limit can be set through archive engine's command line option and API (e.g., Archive::setFileSizeLimito). Default file size limit is set at 100 MB. This is based on one observation in pre-production evaluation using real tool log data. Allowing file filtering based on a configurable size limit improves archiving performance and reduces storage consumption.

It is noted that the system also may store user context files. The user context files may be files (input and/or output files) of EDA tools that are used for a tool run or output from a tool run. The files may comprise, for example, log files, design files, model files and timing files.

Figure 1:
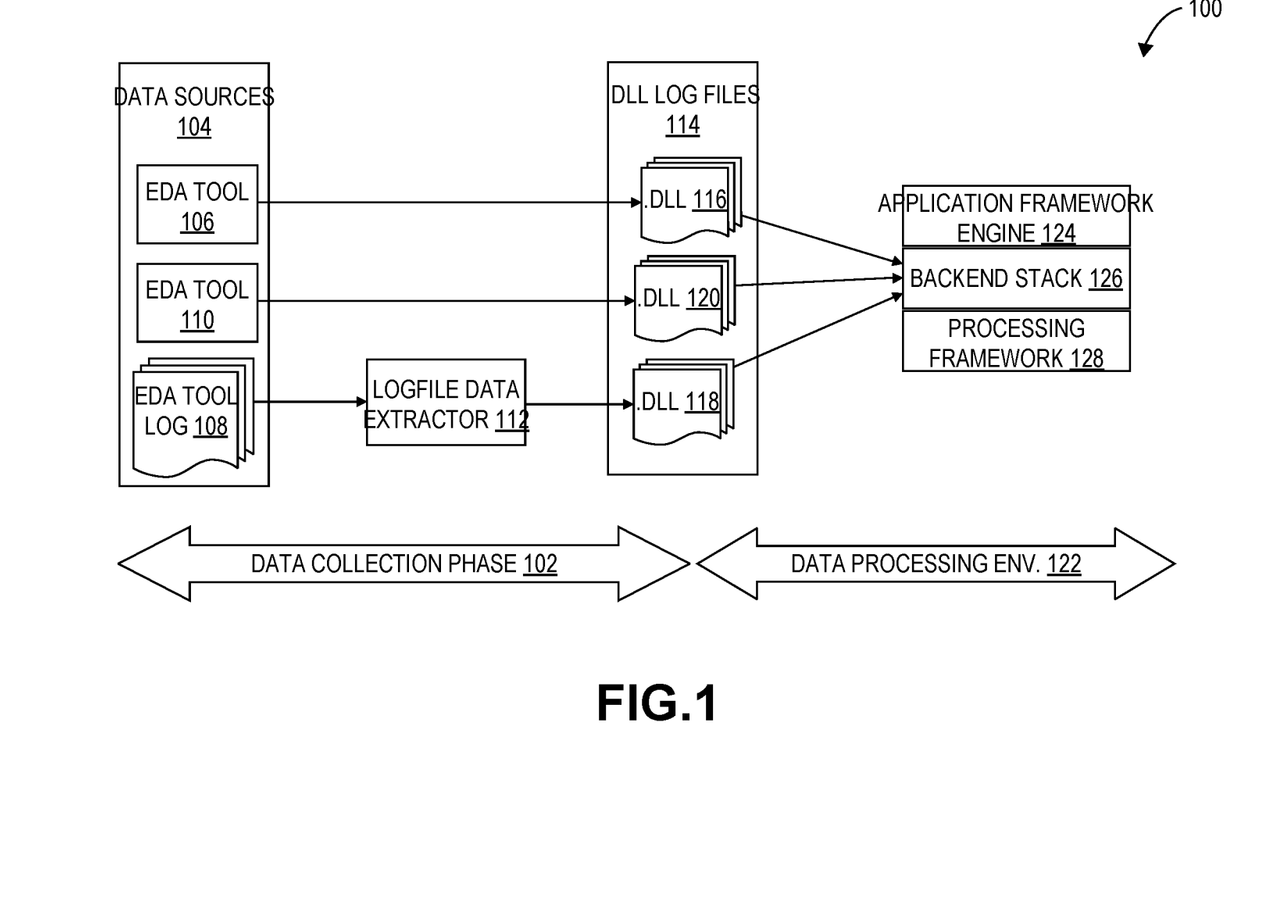
FIG. 1 illustrates an overview of a process of data collection and data processing 100 in accordance with one embodiment.

Referencing FIG. 1, a process of data collection and data processing 100 comprises a data collection phase 102, .CLL log files 114 comprising a .cll 116, a .cll 118, and a .cll 120, and a data processing environment 122. The data collection phase 102 comprises data sources 104 comprising an EDA tool 106, an EDA tool log 108, and EDA tool 110, and a logfile data extractor 112. The data processing environment 122 comprises an application framework engine 124, a backend stack 126, and a processing framework 128.

An overview of data collection and data processing phases is illustrated in FIG. 1. The data collection phase 102 comprises a plurality of data sources 104 which in this embodiment comprise an EDA tool 106 and EDA tool 110 which may be either a front end tool or a back end tool. In other instances, data sources 104 comprises log files, EDA tool log files (i.e., EDA tool log 108), or other sources of data. In one embodiment, each of the data sources 104 feeds a .cll log file such as is in common use in many data processing environment 122.

The data processing environment 122 comprises an application framework engine 124, backend stack 126, and processing framework 128 that receive as an input the .CLL log files 114 comprising .cll 116, .cll 118, and .cll 120.

Referencing FIG. 2, a process of operating a log file data extractor 200 comprises an EDA tool log file 202, a Tool "x" name (toolname) 204, an additional extract extract file (extract_toolname.json) 206, a log file data extractor 208, a data file (CLL/CLE format) 210, and extract files 212 comprising a Tool 1 specific extract file (extract_VCS.json) 214, a Tool 2 specific extract file (extract_DC.json) 216, a Tool 3 specific extract file (extract PT.json) 218, and a Tool n specific extract file (extract_toolname.json) 220.

The log file data extractor 208 extracts relevant data from EDA tool log file 202 to data file (CLL/CLE format) 210. The extraction performed by the log file data extractor 208 is controlled by extract files 212. The extract files 212 use extensible format to specify how relevant data are to be extracted from specific EDA tool log file 202 into data file (CLL/CLE format) 210.

Referencing FIG. 3, an extract file sample 300 comprises a tool name 302, a search string 304, a field position 306, a CLL field key 308, and a CLL field type 310.

<tool name> tool name 302: This is the name of the tool used to create the log file <search string> search string 304: String of characters you want to search in the log file, Regular expressions can be used <fld posn> field position 306: an integer, position of the field value in a line in the log file. The line in log file is split into tokens and numbered, starting the count from 1. There can be more than one integer in a comma separated list like: [4] or [4,5,6,].

<cll fld key> CLL field key 308: This is the key like _cpu_, _tool_version_, etc. for the fields in CLL file <attribute text>: This is the attribute text that will go to the CLL line in the attribute position.

<cll fld type> CLL field type 310: This is the CLL field type like INT, STRING etc, or internal scope VARIABLE.

Referencing FIG. 4A, a CLL consumer flow 400 comprises determining CLL files to process 410, converting to JSON 408, loading JSON to ES 412, and a tool file arching 420. Determining CLL files to process 410 involves checking cfg 402, checking CLL paths 404, and determining any data to load 406. Loading JSON to ES 412 involves determining new index need 414, creating index and schemas 416, and bulk insertion to ES 418.

The CLL consumer flow 400 comprises three parts: convert CLL files to JSON (JavaScript Object Notation), load JSON to ES, and then archive. The consumer flow starts with determining CLL files to process 410 by checking the configuration and CLL paths. For each CLL, the CLL is converted to JSON 408, and then inserted into ES (load JSON to ES 412). After the insertion is done, tool file archiving 420 is performed. Converting, inserting, and archiving can be done in a multi-threaded pipeline to speed up the processing, as will be discussed later.

Figure 4B:
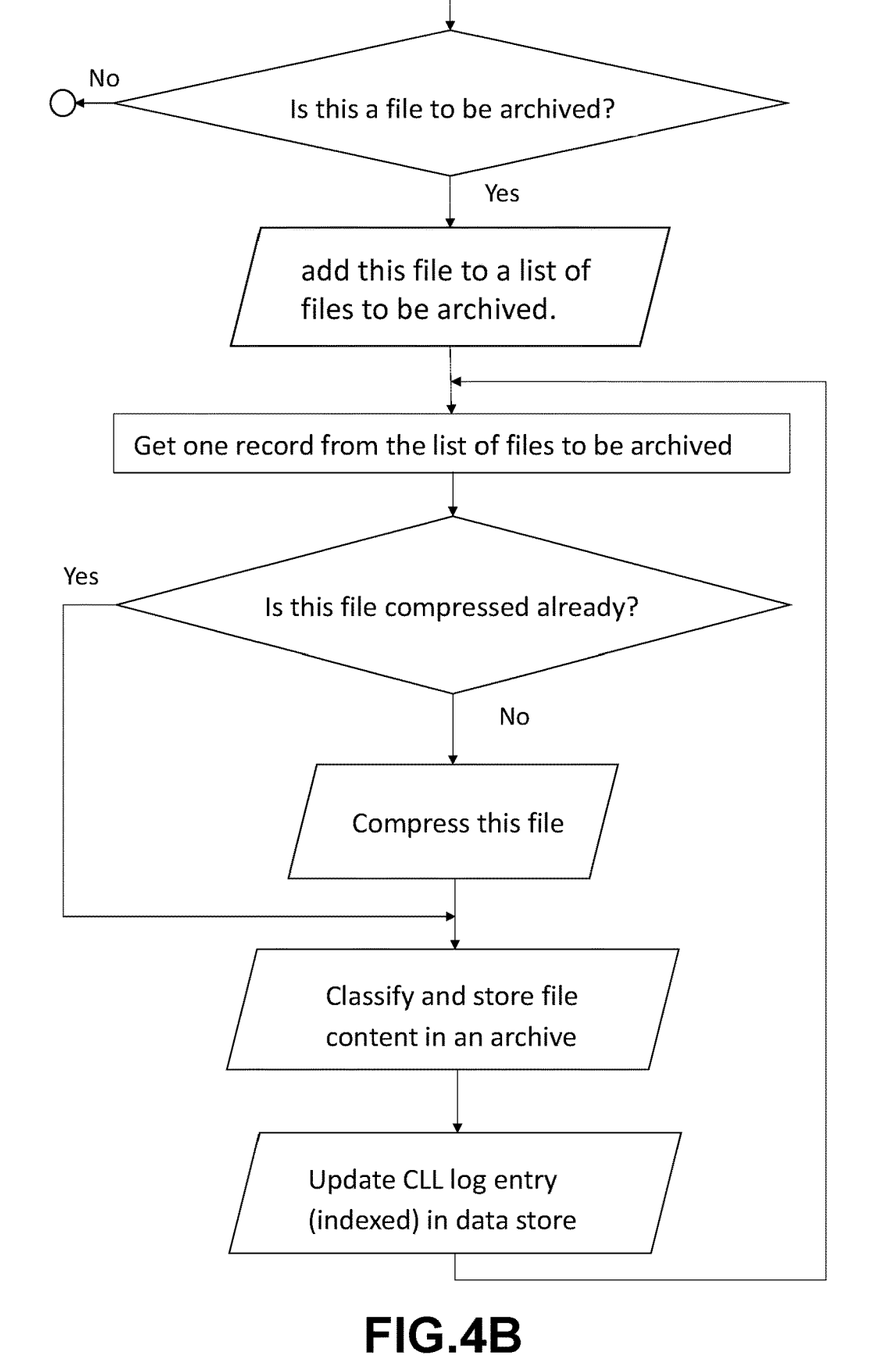
FIG. 4B illustrates an example embodiment for tool file archiving 420.

FIG. 4B further illustrates an example operation of the tool file archiving 420. The process determines if a file is to be archived. If not, the process stops. If so, the file is added to a list of files to be archived. The process gets one record from the list of files to be archived and determines if the file has already been compressed. If not the file is compressed. Once the file is compressed the process classifies and stores the file content in an archive. The process updates the CLL log entry (indexed) in the data store. The process continues with obtaining the next record from the list of files to be archived and continues through the steps of compressing (if needed), classifying and updating, until all the files in the list are archived.

Figure 5:
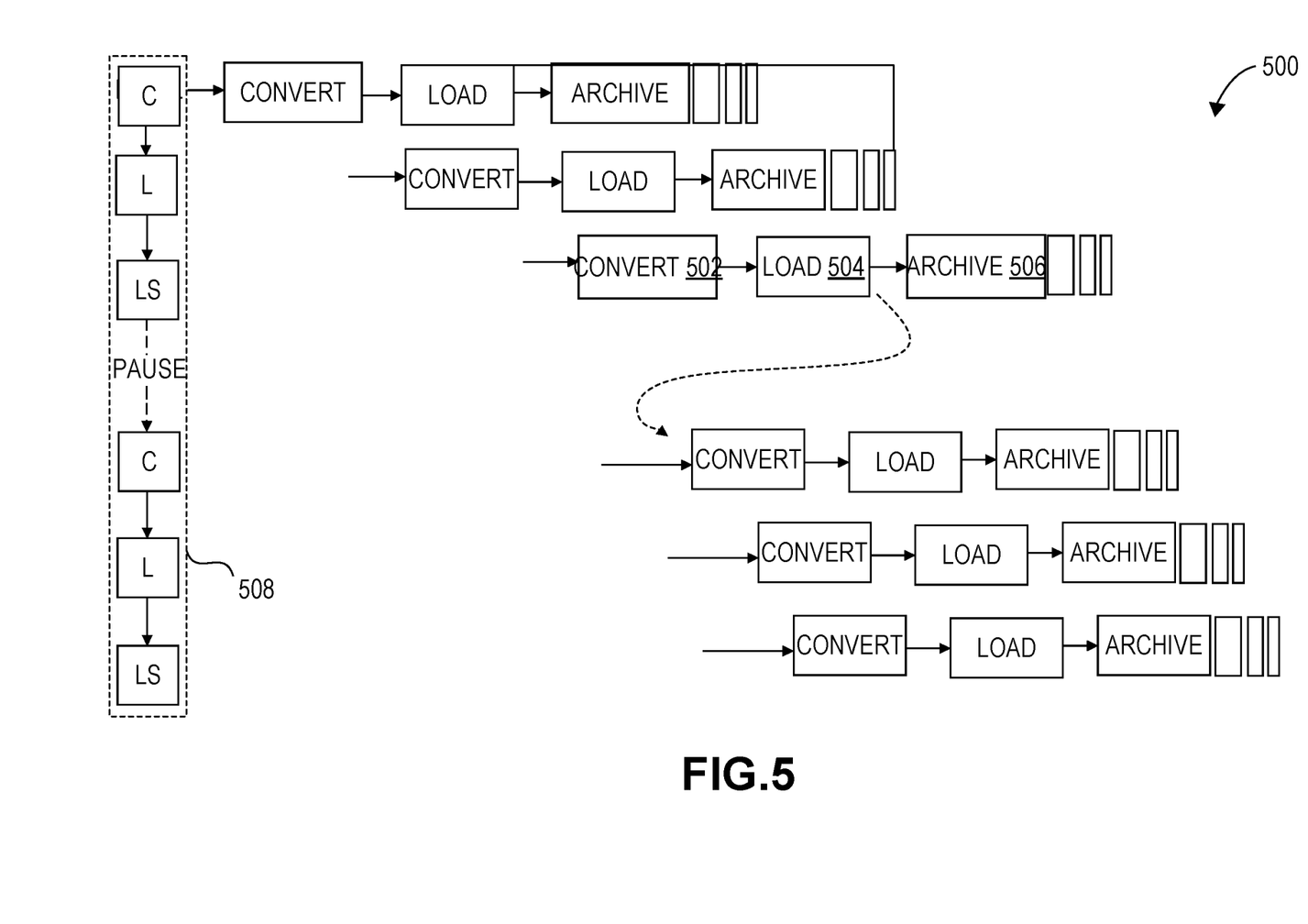
FIG. 5 illustrates an example of a CLL consumer pipeline 500 in accordance with one embodiment.

Referencing FIG. 5, a CLL consumer pipeline 500 comprises a multi-threaded pipeline 508 comprising a convert task thread 502, a load task thread 504, and an archive task thread 506.

To achieve good throughput, CLL consumer adopts a data processing pipeline, which is made of a few concurrent threads (or processes). As described in FIG. 4A, the consumer flow consists of "convert", "load" and "archive" tasks. These three tasks can be executed in a multi-threaded pipeline 508. The convert task thread 502 converts CLL to JSON; the load task thread 504 loads JSON to ES, and the archive task thread 506 does the archiving.

Figure 6:
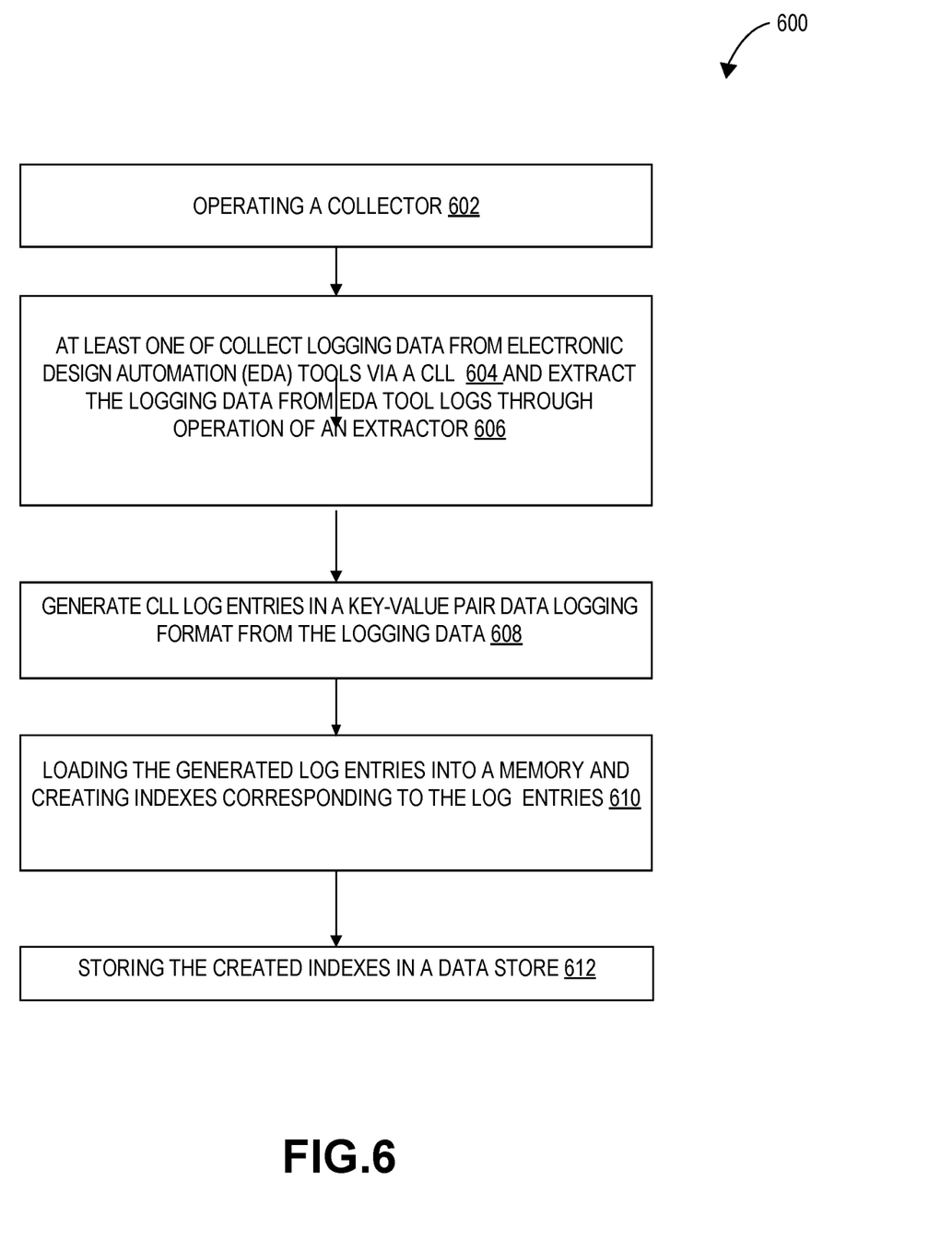
FIG. 6 illustrates an example method of operating a high-performance learning-ready platform for real-time analytics 600 in accordance with one embodiment.

Referencing FIG. 6, the method of operating a high-performance learning-ready platform for real-time analytics 600 involves operating a collector (block 602). The collector collects logging data from electronic design automation (EDA) tools via a CLL (block 604) and/or extracts the logging data from EDA tool logs through operation of an extractor (block 606). The collector generates CLL log entries in a key-value pair data logging format from the logging data (block 608). In block 610, the method of operating a high-performance learning-ready platform for real-time analytics 600 loads the generated CLL log entries and creates indexes corresponding to the CLL log entries. The indexes may be stored in a controlled memory data structure through operation of a memory controller. The loading and index creation may be as described with FIG. 4A. In block 612, the method of operating a high-performance learning-ready platform for real-time analytics 600 stores the indexes in a data store. The system may prioritize storage of particular data logs based, in part, on previously stored data logs in the controlled memory data structure through operation of a comparator in an archiving engine.

Figure 7:
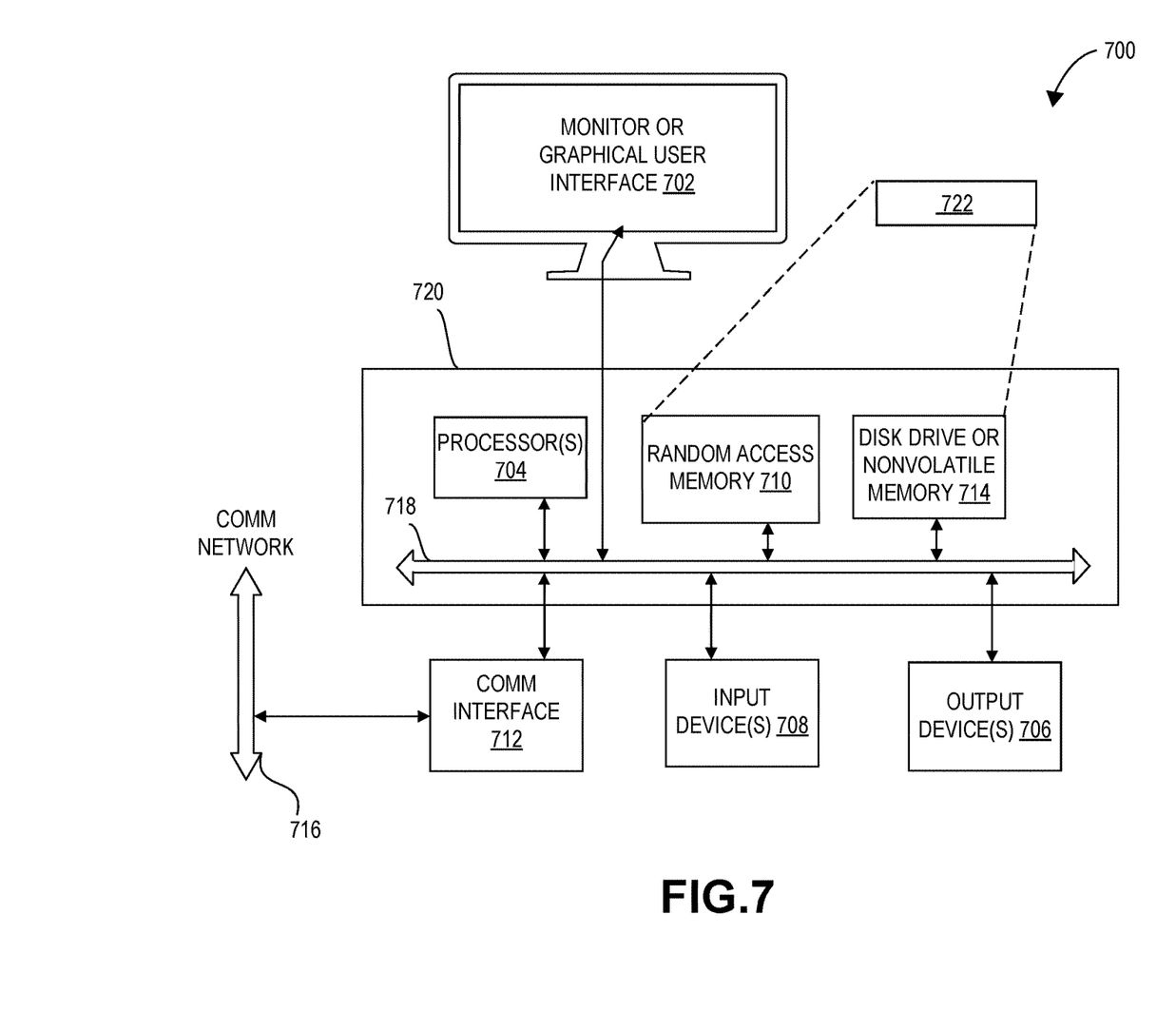
FIG. 7 is an example block diagram of a computer system 700 that may incorporate the disclosed embodiments.

FIG. 7 is an example block diagram of a computer system 700 that may incorporate embodiments of the present invention. FIG. 7 is merely illustrative of a machine system to carry out aspects of the technical processes described herein, and does not limit the scope of the claims. One of ordinary skill in the art would recognize other variations, modifications, and alternatives. In one embodiment, the computer system 700 typically includes a monitor or graphical user interface 702, a computer 720, a communication network interface 712, input device(s) 708, output device(s) 706, and the like.

As depicted in FIG. 7, the computer 720 may include one or more processor(s) 704 that communicate with a number of peripheral devices via a bus subsystem 718. These peripheral devices may include input device(s) 708, output device(s) 706, communication network interface 712, and a storage subsystem, such as a random access memory 710 and a disk drive or nonvolatile memory 714.

The random access memory 710 and/or the disk drive or nonvolatile memory 714 may store computer-executable program code (e.g., software comprised of executable instructions) and thus forming logic 722 that when applied to and executed by the processor(s) 704 implement embodiments of the processes disclosed herein. In an embodiment, logic 722 includes logic for a collector, a selector, a memory controller, and a comparator.

The input device(s) 708 include devices and mechanisms for inputting information to the computer 720. These may include a keyboard, a keypad, a touch screen incorporated into the monitor or graphical user interface 702, audio input devices such as voice recognition systems, microphones, and other types of input devices. In various embodiments, the input device(s) 708 are typically embodied as a computer mouse, a trackball, a track pad, a joystick, wireless remote, drawing tablet, voice command system, eye tracking system, and the like. The input device(s) 708 typically allow a user to select objects, icons, text and the like that appear on the monitor or graphical user interface 702 via a command such as a click of a button or the like.

The output device(s) 706 include all possible types of devices and mechanisms for outputting information from the computer 720. These may include a display (e.g., monitor or graphical user interface 702), non-visual displays such as audio output devices, etc.

The communication network interface 712 provides an interface to communication networks (e.g., communication network 716) and devices external to the computer 720. The communication network interface 712 may serve as an interface for receiving data from and transmitting data to other systems. Embodiments of the communication network interface 712 typically include an Ethernet card, a modem (telephone, satellite, cable, ISDN), (asynchronous) digital subscriber line (DSL) unit, FireWire interface, USB interface, and the like. For example, the communication network interface 712 may be coupled to the communication network 716 via a FireWire bus, or the like. In other embodiments, the communication network interface 712 may be physically integrated on the motherboard of the computer 720, and may be a software program, such as soft DSL, or the like.

In various embodiments, the computer system 700 may also include software that enables communications over a network such as the HTTP, TCP/IP, RTP/RTSP protocols, and the like. In alternative embodiments, other communications software and transfer protocols may also be used, for example IPX, UDP or the like. In some embodiments, the computer 720 in the processor(s) 704 may include one or more microprocessors from Intel®. Further, one embodiment, the computer 720 includes a UNIX-based operating system.

The random access memory 710 and the disk drive or nonvolatile memory 714 are examples of tangible media configured to store data and instructions to implement various embodiments of the processes described herein, including executable computer program code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. The random access memory 710 and the disk drive or nonvolatile memory 714 may be configured to store the basic programming and data constructs that provide the functionality of the disclosed processes and other embodiments thereof that fall within the scope of the disclosed embodiments.

Software program code modules and instructions that implement embodiments of the present invention may be stored in the random access memory 710 and/or the disk drive or nonvolatile memory 714. These software modules may be executed by the processor(s) 704. The random access memory 710 and the disk drive or nonvolatile memory 714 may also provide a repository for storing data used by the software modules.

The random access memory 710 and the disk drive or nonvolatile memory 714 may include a number of memories including a main random access memory (RAM) for storage of instructions and data during program execution and a read only memory (ROM) in which fixed non-transitory instructions are stored. The random access memory 710 and the disk drive or nonvolatile memory 714 may include a file storage subsystem providing persistent (non-volatile) storage for program and data files. The random access memory 710 and the disk drive or nonvolatile memory 714 may include removable storage systems, such as removable flash memory.

The bus subsystem 718 provides a mechanism for letting the various components and subsystems of computer 720 communicate with each other as intended. Although the communication network interface 712 is depicted schematically as a single bus, alternative embodiments of the bus subsystem 718 may utilize multiple busses.

It will be readily apparent to one of ordinary skill in the art that many other hardware and software configurations are suitable for use with embodiments disclosed herein. For example, the computer may be a desktop, portable, rack-mounted or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Those having skill in the art will appreciate that there are various logic implementations by which processes and/or systems described herein can be effected (e.g., hardware, software, or firmware), and that the preferred vehicle will vary with the context in which the processes are deployed. If an implementer determines that speed and accuracy are paramount, the implementer may opt for a hardware or firmware implementation; alternatively, if flexibility is paramount, the implementer may opt for a solely software implementation; or, yet again alternatively, the implementer may opt for some combination of hardware, software, or firmware. Hence, there are numerous possible implementations by which the processes described herein may be effected, none of which is inherently superior to the other in that any vehicle to be utilized is a choice dependent upon the context in which the implementation will be deployed and the specific concerns (e.g., speed, flexibility, or predictability) of the implementer, any of which may vary. Those skilled in the art will recognize that optical aspects of implementations may involve optically-oriented hardware, software, and or firmware.

Those skilled in the art will appreciate that logic may be distributed throughout one or more devices, and/or may be comprised of combinations memory, media, processing circuits and controllers, other circuits, and so on. Therefore, in the interest of clarity and correctness logic may not always be distinctly illustrated in drawings of devices and systems, although it is inherently present therein. The techniques and procedures described herein may be implemented via logic distributed in one or more computing devices. The particular distribution and choice of logic will vary according to implementation.

The foregoing detailed description has set forth various embodiments of the devices or processes via the use of block diagrams, flowcharts, or examples. Insofar as such block diagrams, flowcharts, or examples contain one or more functions or operations, it will be understood as notorious by those within the art that each function or operation within such block diagrams, flowcharts, or examples can be implemented, individually or collectively, by a wide range of hardware, software, firmware, or virtually any combination thereof. Portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in standard integrated circuits, as one or more computer programs running on one or more processing devices (e.g., as one or more programs running on one or more computer systems), as one or more programs running on one or more processors (e.g., as one or more programs running on one or more microprocessors), as firmware, or as virtually any combination thereof, and that designing the circuitry or writing the code for the software or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies equally regardless of the particular type of signal bearing media used to actually carry out the distribution. Examples of a signal bearing media include, but are not limited to, the following: recordable type media such as floppy disks, hard disk drives, CD ROMs, digital tape, flash drives, SD cards, solid state fixed or removable storage, and computer memory.

In a general sense, those skilled in the art will recognize that the various aspects described herein which can be implemented, individually or collectively, by a wide range of hardware, software, firmware, or any combination thereof can be viewed as being composed of various types of circuitry.

Those skilled in the art will recognize that it is common within the art to describe devices or processes in the fashion set forth herein, and thereafter use standard engineering practices to integrate such described devices or processes into larger systems. At least a portion of the devices or processes described herein can be integrated into a network processing system via a reasonable amount of experimentation. Various embodiments are described herein and presented by way of example and not limitation.

What is claimed is:

1. A method of operating a high-performance learning-ready platform for real-time analytics comprises:
    receiving a user-specified selection of a tool-specific extract file from a plurality of tool-specific extract files,
        wherein each tool-specific extract file is associated with a corresponding electronic design automation (EDA) tool of a plurality of EDA tools that each generate logging data of a different format, and
        wherein the tool-specific extract file is customized to identify key-value pairs in the logging data with a plurality of formats specific to respective versions of the corresponding EDA tool, wherein each respective version of the corresponding EDA tool generates logging data corresponding to a format of the plurality of formats;
    collecting the logging data from an EDA tool;
    extracting one or more key-value pairs from the logging data using the user-specified tool-specific extract file, a value of the extracted one or more key-value pairs including a version of the EDA tool;
    generating a common logging library (CLL) log entry based on the one or more key-value pairs;
    loading the generated CLL log entry into a memory;
    creating an index corresponding to the generated CLL log entry; and
    storing the created index in a data store.

2. The method of claim 1, wherein the CLL log entry is in a CLL format file.

3. The method of claim 2, wherein CLL format file comprises a key, a data type, and a value.

4. The method of claim 3, wherein the CLL format file comprises an attribute and a hint.

5. The method of claim 4, wherein the hint comprises a string for data gathering system as to how to organize the data.

6. The method of claim 1, further comprising storing an EDA tool operation context file derived from the CLL log entry.

7. The method of claim 6, wherein the EDA tool operation context file is a file used for input into an EDA tool or output from the EDA tool.

8. The method of claim 7, wherein the file is one of a log file, design file, model file, or timing file.

9. The method of claim 1, wherein creating the index corresponding to the generated CLL log entry comprises creating a log entry name for the generated CLL log entry using one or more of a user identifier, machine name, process identifier, and a time of day.

10. The method of claim 1, wherein the first entry of the generated CLL log entry is a CLL log format version indicative of a version of a format of the user-specified tool-specific extract file.

11. The method of claim 1, wherein one of the plurality of tool-specific extract files is a default tool-specific extract file.

12. The method of claim 1, wherein a format of the user-specified tool-specific extract file includes a search string specifying a position of a value in a line of the collected logging data, the line split into numbered tokens, wherein the position is an integer greater than or equal to 1.

13. The method of claim 1, wherein loading the generated CLL log entry into the memory comprises:
    generating a CLL file in the memory, the CLL file including the CLL log entry;
    converting the CLL file to a JavaScript® Object Notation (JSON) file; and
    loading the JSON file into the memory.

14. The method of claim 13, further comprising:
    determining whether the JSON file has been compressed; and
    in response to determining that the JSON file has not been compressed:
        compressing the JSON file, and
        updating the created index in the data store.

15. The method of claim 13, further comprising deleting, responsive to loading the JSON file into the memory, the CLL file from the memory.

16. A non-transitory computer readable storage medium comprising stored program code to operate a high-performance learning-ready platform for real-time analytics, the program code when executed causes at least one processor to:
    receive a user-specified selection of a tool-specific extract file from a plurality of tool-specific extract files,
        wherein each tool-specific extract file is associated with a corresponding electronic design automation (EDA) tool of a plurality of EDA tools that each generate logging data of a different format, and
        wherein the tool-specific extract file is customized to identify key-value pairs in the logging data with a plurality of formats specific to respective versions of the corresponding EDA tool, wherein each respective version of the corresponding EDA tool generates logging data corresponding to a format of the plurality of formats;
    collect the logging data from an EDA tool;
    extract one or more key-value pairs from the logging data using the user-specified tool-specific extract file, a value of the extracted one or more key-value pairs including a version of the EDA tool;

generate a common logging library (CLL) log entry based on the one or more key-value pairs;

load and indexing the generated CLL log entry into a controlled memory data structure through operation of a memory controller; and prioritize storage of the generated CLL log entry based, in part, on previously stored CLL log entries in the controlled memory data structure through operation of a comparator in an archiving engine.

17. The non-transitory computer readable storage medium of claim 16, wherein the CLL log entries are in a CLL format file.

18. The non-transitory computer readable storage medium of claim 17, wherein CLL format file comprises a key, a data type, and a value.

19. The non-transitory computer readable storage medium of claim 18, wherein the CLL format file comprises an attribute and a hint.

20. The non-transitory computer readable storage medium of claim 16, further comprising program code that when executed by the at least one processor causes the at least one processor to store an EDA tool operation context file derived from the CLL log entry.

* * * * *